US012609178B2

(12) United States Patent
Jung

(10) Patent No.: US 12,609,178 B2
(45) Date of Patent: Apr. 21, 2026

(54) TEST CIRCUIT AND SEMICONDUCTOR MEMORY SYSTEM INCLUDING THE TEST CIRCUIT

(71) Applicant: SK hynix Inc., Icheon-si (KR)

(72) Inventor: Jong Seok Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 219 days.

(21) Appl. No.: 18/516,448

(22) Filed: Nov. 21, 2023

(65) Prior Publication Data

US 2025/0006291 A1     Jan. 2, 2025

(30) Foreign Application Priority Data

Jun. 27, 2023     (KR) ........................ 10-2023-0082753

(51) Int. Cl.
| | |
|---|---|
| *G11C 29/38* | (2006.01) |
| *G11C 29/02* | (2006.01) |
| *G11C 29/12* | (2006.01) |
| *G11C 29/40* | (2006.01) |

(52) U.S. Cl.
CPC ............ *G11C 29/38* (2013.01); *G11C 29/023* (2013.01); *G11C 29/12005* (2013.01); *G11C 2029/4002* (2013.01)

(58) Field of Classification Search
CPC . G11C 29/38; G11C 29/023; G11C 29/12005; G11C 2029/4002; G11C 29/025; G11C 29/20
See application file for complete search history.

(56) References Cited

U.S. PATENT DOCUMENTS

| | | | |
|---|---|---|---|
| 11,482,298 B2 | 10/2022 | Nevill et al. | |
| 11,538,549 B2 | 12/2022 | Jung et al. | |
| 2008/0313510 A1 * | 12/2008 | Baker .................. | G11C 29/026 714/718 |

* cited by examiner

*Primary Examiner* — Xiaochun L Chen
(74) *Attorney, Agent, or Firm* — WILLIAM PARK AND ASSOCIATES LTD.

(57) ABSTRACT
A test circuit including a test core configured to set a charging current quantity as a first value and perform charging and discharging on a test node of a test target circuit during a first measurement interval and configured to change the charging current quantity from the first value to a second value and perform charging and discharging on the test node during a second measurement interval, and an operation circuit configured to generate a first counting value by counting a clock signal during the first measurement interval, generate a second counting value by counting the clock signal during the second measurement interval, generate the results of an operation of the first counting value and the second counting value as operation results, and output at least one of the first counting value, the second counting value, and the operation results as test result information.

18 Claims, 8 Drawing Sheets

TEST CIRCUIT AND SEMICONDUCTOR MEMORY SYSTEM INCLUDING THE TEST CIRCUIT

CROSS-REFERENCES TO RELATED APPLICATION

The present application claims priority under 35 U.S.C. § 119 (a) to Korean Patent Application No. 10-2023-0082753, filed on Jun. 27, 2023, in the Korean Intellectual Property Office, which is incorporated herein by reference in its entirety.

BACKGROUND

1. Technical Field

The present technology generally relates to a semiconductor circuit, and particularly, to a test circuit and a semiconductor memory system including the test circuit.

2. Related Art

In general, it is essential to verify the reliability of an operation of a semiconductor device, such as semiconductor memory, through various test operations. Various defects, such as a resistive defect and a leakage current defect, occur in circuit components included in the semiconductor device, for example, a metal line. Accordingly, it is necessary to develop a test circuit for detecting various defects in the semiconductor device rapidly and accurately.

SUMMARY

In an embodiment, a test circuit may include a test core configured to set a charging current quantity as a first value and perform charging and discharging on a test node of a test target circuit during a first measurement interval and configured to change the charging current quantity from the first value to a second value and perform charging and discharging on the test node during a second measurement interval, and an operation circuit configured to generate a first counting value by counting a clock signal during the first measurement interval, generate a second counting value by counting the clock signal during the second measurement interval, generate the results of an operation of the first counting value and the second counting value as operation results, and output at least one of the first counting value, the second counting value, and the operation results as test result information.

In an embodiment, a test circuit may include a test core configured to set one of a charging reference voltage and a discharging reference voltage as a first value and perform charging and discharging on a test node of a test target circuit during a first measurement interval and configured to change one of the charging reference voltage and the discharging reference voltage from the first value to a second value and to perform charging and discharging on the test node during a second measurement interval, and an operation circuit configured to generate a first counting value by counting a clock signal during the first measurement interval, generate a second counting value by counting the clock signal during the second measurement interval, generate the results of an operation of the first counting value and the second counting value as operation results, and output at least one of the first counting value, the second counting value, and the operation results as test result information.

In an embodiment, a semiconductor memory system may include a memory device including a plurality of memory cells that are coupled to a plurality of word lines, wherein the plurality of memory cells are divided into a plurality of first unit areas and each of the plurality of first unit areas is divided into a plurality of second unit areas, and a test circuit that is coupled to at least one of the plurality of first memory regions. The test circuit may be configured to separately perform charging and discharging on a test node capable of being selectively coupled to the plurality of word lines during a first measurement interval and a second measurement interval, generate a first counting value and a second counting value by counting the first measurement interval and the second measurement interval, generate results of an operation of the first counting value and the second counting value as operation results, and output at least one of the first counting value, the second counting value, and the operation results as test result information.

DETAILED DESCRIPTION

Hereinafter, embodiments of the present technology will be described in detail with reference to the accompanying drawings. For reference, for convenience of description, a circuit on which a test operation is performed is referred to as a "test target circuit".

Embodiments of the present technology provide a test circuit capable of detecting various defects in a semiconductor device and a semiconductor memory system including the test circuit.

The present technology can increase the accuracy of measured results and also measure various defects in a way to measure a defect in a metal line by adjusting a test condition.

An embodiment of the present technology can increase the accuracy of measured results and also measure various defects in a way to measure a defect in a metal line by adjusting a test condition.

Figure 1:
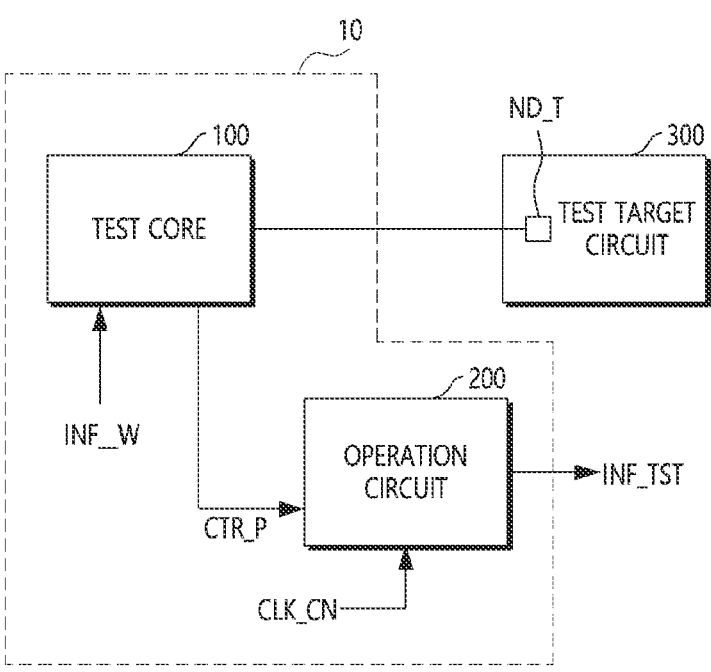
FIG. 1 is a diagram illustrating a construction of a test circuit according to an embodiment.

FIG. 1 is a diagram illustrating a construction of a test circuit 10 according to an embodiment.

Referring to FIG. 1, the test circuit 10 may include a test core 100 and an operation circuit 200. The test circuit 10 may be coupled to a test node ND_T of a test target circuit 300.

The test target circuit 300 may include an integrated circuit including a semiconductor device, such as a memory device. A plurality of internal circuits of the integrated circuit may be coupled to a plurality of metal lines. At least one of the plurality of metal lines may be selectively coupled to the test node ND_T based on internal control of the integrated circuit. If the integrated circuit is a memory device, the metal line may include a word line.

The test core 100 may set a charging current quantity as a first value and repeatedly perform charging and discharging on the test node ND_T at least once during a first measurement interval, and may change the charging current quantity from the first value to a second value and repeatedly perform charging and discharging on the test node ND_T at least once during a second measurement interval.

The test core 100 may be coupled to the test node ND_T, may receive interval setting information INF_W, and may output an interval signal CTR_P. The test core 100 may vary at least one of the first measurement interval and the second measurement interval in response to the interval setting information INF_W, and may generate the interval signal CTR_P corresponding to the first measurement interval and the second measurement interval.

The operation circuit 200 may receive the interval signal CTR_P and a clock signal CLK_CN and output test result information INF_TST. The operation circuit 200 may generate a first counting value by counting the clock signal CLK_CN during the first measurement interval, may generate a second counting value by counting the clock signal CLK_CN during the second measurement interval, may generate the results of an operation of the first counting value and the second counting value as operation results, and may output at least one of the first counting value, the second counting value, and the operation results as the test result information INF_TST. The clock signal CLK_CN may be a clock signal for a counting operation. The clock signal CLK_CN may be a signal that is provided within the test circuit 10 or from the outside of the test circuit 10.

The operation circuit 200 may include at least one of the first counting value and the second counting value in the test result information INF_TST as reference information for determining a high resistive defect in the test target circuit 300. The operation circuit 200 may include the operation results in the test result information INF_TST as reference information for determining a leakage current defect in the test target circuit 300.

A test result determination system outside the test circuit 10 may determine the high resistive defect in the test target circuit 300 based on the first counting value or the second counting value that is provided by the test circuit 10, and may determine the leakage current defect in the test target circuit 300 based on the operation results that are provided by the test circuit 10.

Figure 2:
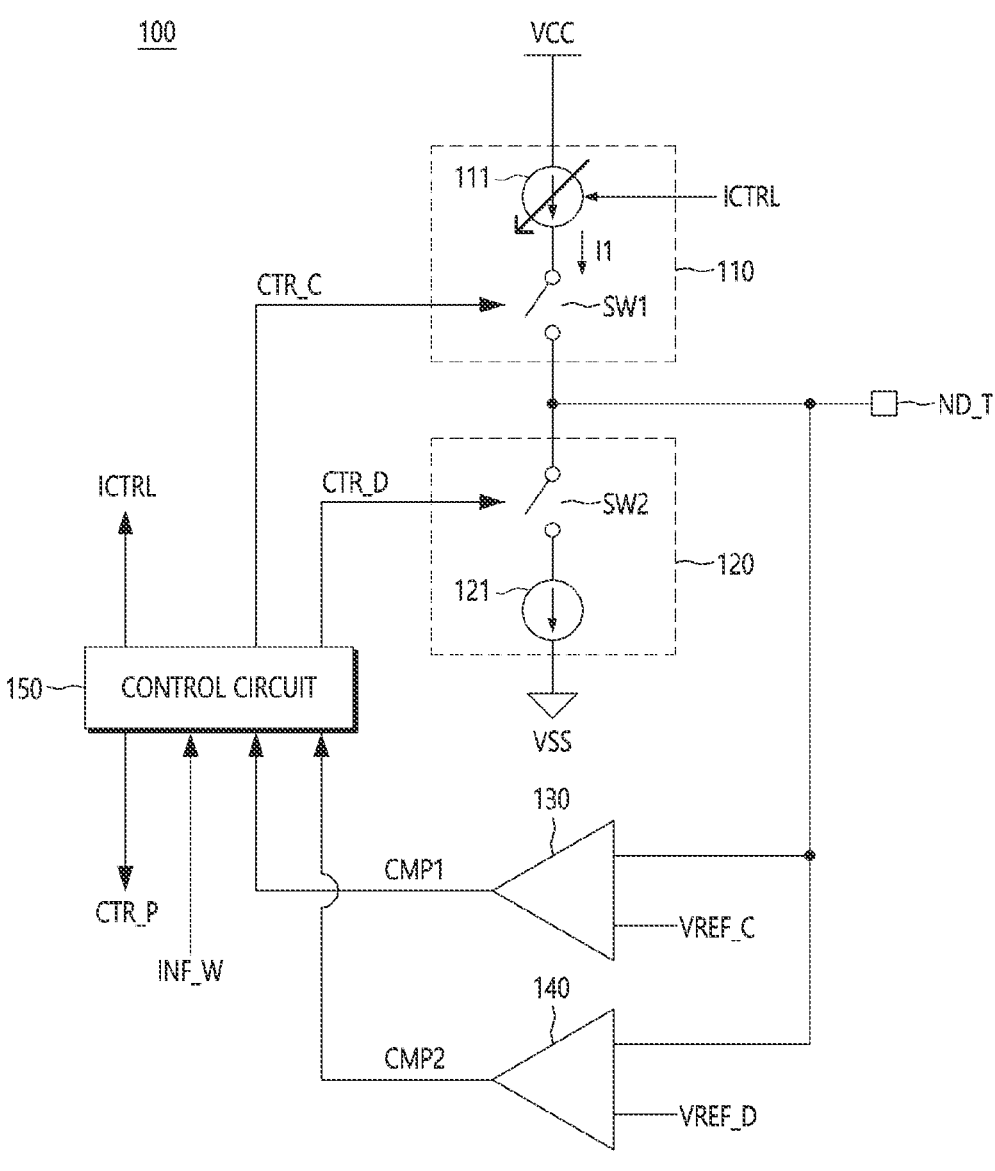
FIG. 2 is a diagram illustrating a construction of a test core illustrated in FIG. 1.

FIG. 2 is a diagram illustrating a construction of the test core 100 illustrated in FIG. 1.

Referring to FIG. 2, the test core 100 may include a charging circuit 110, a discharging circuit 120, a first comparison circuit 130, a second comparison circuit 140, and a control circuit 150.

The charging circuit 110 may charge the test node ND_T in response to a charging control signal CTR_C. The charging circuit 110 may include a first current source circuit 111 and a first switching circuit SW1 that are coupled in series between a power supply stage VCC and the test node ND_T. The first current source circuit 111 may adjust the amount of current for charging the test node ND_T, that is, a charging current quantity I1, in response to a current control signal ICTRL. The first switching circuit SW1 may control an operation of coupling the first current source circuit 111 and the test node ND_T in response to the charging control signal CTR_C. The first switching circuit SW1 may be turned on when the charging control signal CTR_C has a high level, and may be turned off when the charging control signal CTR_C has a low level. For reference, an embodiment including additional components may be provided. Furthermore, an active high or active low configuration indicating an active state of a signal or circuit may be changed depending on embodiments. Further, the logic levels of the signals may be different from or the opposite of those described. For example, a signal described as having a logic "high" level may alternatively have a logic "low" level, and a signal described as having a logic "low" level may alternatively have a logic "high" level.

The discharging circuit 120 may discharge the test node ND_T in response to a discharging control signal CTR_D. The discharging circuit 120 may include a second switching circuit SW2 and a second current source circuit 121 that are coupled in series between the test node ND_T and a ground power stage VSS. The second switching circuit SW2 may control an operation of coupling the test node ND_T and the second current source circuit 121 in response to the discharging control signal CTR_D. The second switching circuit SW2 may be turned on when the discharging control signal CTR_D has a high level, and may be turned off when the discharging control signal CTR_D has a low level.

The first comparison circuit 130 may generate a first comparison signal CMP1 by comparing the voltage level of the test node ND_T and the voltage level of a charging reference voltage VREF_C. The charging reference voltage VREF_C may correspond to a charging voltage level, that is, a target, after the start of a charging operation for the test node ND_T. The first comparison circuit 130 may generate the first comparison signal CMP1 capable of turning on the first switching circuit SW1 of the charging circuit 110 when the voltage level of the test node ND_T is lower than the voltage level of the charging reference voltage VREF_C.

The second comparison circuit 140 may generate a second comparison signal CMP2 by comparing the voltage level of the test node ND_T and the voltage level of a discharging reference voltage VREF_D. The discharging reference voltage VREF_D may correspond to a discharging voltage level, that is, a target, after the start of a discharging operation for the test node ND_T. The second comparison circuit 140 may generate the second comparison signal CMP2 capable of turning on the second switching circuit SW2 of the discharging circuit 120 when the voltage level of the test node ND_T is higher than the voltage level of the discharging reference voltage VREF_D.

The control circuit 150 may receive the interval setting information INF_W, the first comparison signal CMP1, and the second comparison signal CMP2, and may output the charging control signal CTR_C, the discharging control signal CTR_D, the interval signal CTR_P, and the current control signal ICTRL. The interval setting information INF_W may be information for adjusting the first measurement interval and the second measurement interval. The first measurement interval and the second measurement interval may each include a plurality of unit measurement intervals. An interval in which charging is performed once and an interval in which discharging is performed once may each be referred to as a unit measurement interval. For example, if the interval setting information INF_W defines "4", each of the first measurement interval and the second measurement interval may be set as intervals corresponding to four unit measurement intervals, that is, charging-discharging-charging-discharging or discharging-charging-discharging-charging. Accordingly, the control circuit 150 may vary at least one of the first measurement interval and the second measurement interval in response to the interval setting information INF_W.

The control circuit 150 may generate the interval signal CTR_P corresponding to the first measurement interval and the second measurement interval that have been adjusted in response to the interval setting information INF_W. The control circuit 150 may generate the charging control signal CTR_C and the discharging control signal CTR_D by using the first comparison signal CMP1 and the second comparison signal CMP2 based on the interval signal CTR_P. The control circuit 150 may maintain the charging control signal CTR_C to a deactivation level, for example, a low level, during a deactivation interval that belongs to a deactivation interval of the interval signal CTR_P and that corresponds to a standby interval between the first measurement interval and the second measurement interval, and may output the first comparison signal CMP1 as the charging control signal CTR_C and the second comparison signal CMP2 as the discharging control signal CTR_D during the remaining intervals of the deactivation interval of the interval signal CTR_P.

The control circuit 150 may vary the charging current quantity I1 of the first current source circuit 111 by using the current control signal ICTRL according to preset test timing, in response to the first comparison signal CMP1 and the second comparison signal CMP2. For example, the control circuit 150 may adjust an initial value of the charging current quantity I1 of the first current source circuit 111 to a first value prior to the first measurement interval by using the current control signal ICTRL, may adjust the charging current quantity I1 of the first current source circuit 111 to the initial value again after the first measurement interval is terminated, may adjust the charging current quantity I1 of the first current source circuit 111 to a second value higher than the first value prior to the second measurement interval, and may adjust the charging current quantity I1 of the first current source circuit 111 to the initial value again after the second measurement interval is terminated. The word "preset" as used herein with respect to a parameter, such as a preset test timing, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 3:
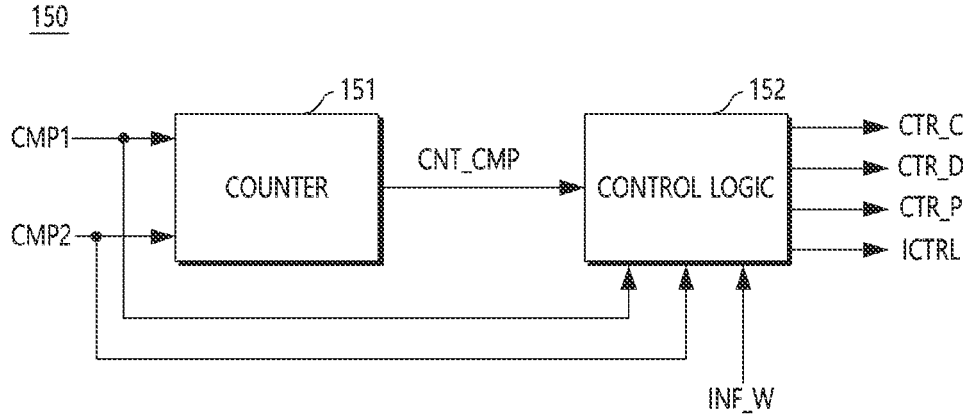
FIG. 3 is a diagram illustrating a construction of a control circuit illustrated in FIG. 2.

FIG. 3 is a diagram illustrating a construction of the control circuit 150 illustrated in FIG. 2.

Referring to FIG. 3, the control circuit 150 may include a counter 151 and control logic 152.

The counter 151 may generate a counting signal CNT_CMP by counting at least one of the first comparison signal CMP1 and the second comparison signal CMP2.

The control logic 152 may generate the charging control signal CTR_C, the discharging control signal CTR_D, the interval signal CTR_P, and the current control signal ICTRL, in response to the interval setting information INF_W, the counting signal CNT_CMP, the first comparison signal CMP1, and the second comparison signal CMP2.

The control logic 152 may generate the interval signal CTR_P corresponding to the first measurement interval and the second measurement interval that have been adjusted in response to the interval setting information INF_W. The control logic 152 may maintain the charging control signal CTR_C to a deactivation level, for example, a low level, during a deactivation interval that belongs to a deactivation interval of the interval signal CTR_P and that corresponds to a standby interval between the first measurement interval and the second measurement interval, and may output the first comparison signal CMP1 as the charging control signal CTR_C and the second comparison signal CMP2 as the discharging control signal CTR_D during the remaining intervals of the deactivation interval of the interval signal CTR_P.

The control logic 152 may adjust an initial value of the charging current quantity I1 of the first current source circuit 111 to a first value prior to the first measurement interval by using the current control signal ICTRL, may adjust the charging current quantity I1 of the first current source circuit 111 to the initial value again after the first measurement interval is terminated, may adjust the charging current quantity I1 of the first current source circuit 111 to a second value higher than the first value prior to the second measurement interval, and may adjust the charging current quantity I1 of the first current source circuit 111 to the initial value again after the second measurement interval is terminated.

Figure 4:
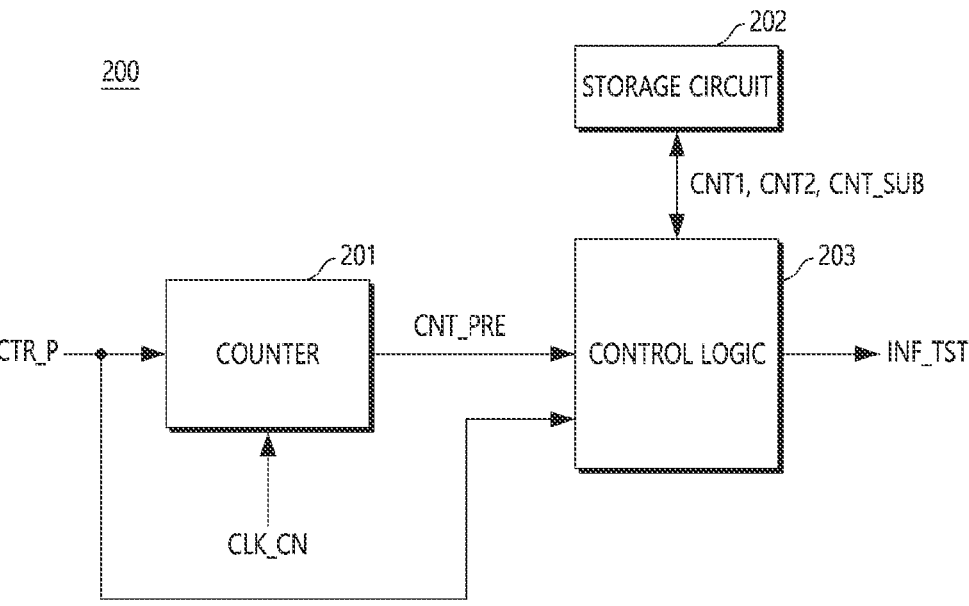
FIG. 4 is a diagram illustrating a construction of an operation circuit illustrated in FIG. 1.

FIG. 4 is a diagram illustrating a construction of the operation circuit 200 illustrated in FIG. 1.

Referring to FIG. 4, the operation circuit 200 may include a counter 201, a storage circuit 202, and control logic 203.

The counter 201 may generate a preliminary counting signal CNT_PRE by counting the clock signal CLK_CN during an activation interval of the interval signal CTR_P.

The control logic 203 may generate a first counting value CNT1, a second counting value CNT2, and operation results CNT_SUB, in response to the interval signal CTR_P and the preliminary counting signal CNT_PRE, may store the first counting value CNT1, the second counting value CNT2, and the operation results CNT_SUB in the storage circuit 202, and may output at least one of the first counting value CNT1, the second counting value CNT2, and the operation results CNT_SUB as the test result information INF_TST.

The control logic 203 may store the preliminary counting signal CNT_PRE in the storage circuit 202 as the first counting value CNT1 based on a transition of the interval signal CTR_P, for example, a falling edge, may store the preliminary counting signal CNT_PRE in the storage circuit 202 as the second counting value CNT2 based on the second falling edge of the interval signal CTR_P, may perform subtraction on the first counting value CNT1 and the second counting value CNT2, and may store a difference value between the first counting value CNT1 and the second counting value CNT2 in the storage circuit 202 as the operation results CNT_SUB. The control logic 203 may output, as the test result information INF_TST, at least one of the first counting value CNT1, the second counting value CNT2, and the operation results CNT_SUB that have been stored in the storage circuit 202.

Figure 5:
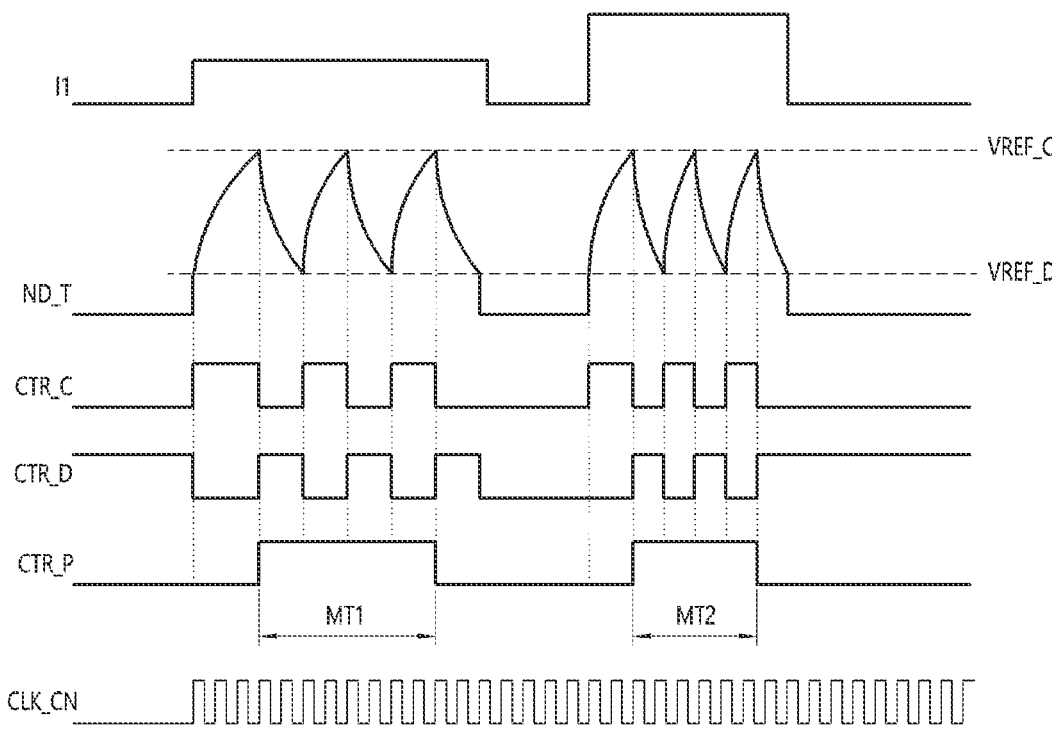
FIG. 5 is an operation timing diagram of the test circuit illustrated in FIG. 1.

FIG. 5 is an operation timing diagram of the test circuit 10 illustrated in FIG. 1.

Hereinafter, an operation of the test circuit 10 is described with reference to FIGS. 1 to 5.

When the charging control signal CTR_C is activated to a high level, the voltage level of the test node ND_T may gradually increase and rise up to the charging reference voltage VREF_C. When the discharging control signal CTR_D is activated to a high level, the voltage level of the test node ND_T may gradually decrease and drop up to the discharging reference voltage VREF_D. The charging control signal CTR_C and the discharging control signal CTR_D may transition based on the voltage level of the test node ND_T.

The test core 100 may adjust an initial value of the charging current quantity I1 to a first value prior to the first measurement interval MT1, and may adjust the charging current quantity I1 to the initial value again after the first measurement interval MT1 is terminated.

During the first measurement interval MT1, the test core 100 may repeatedly perform charging and discharging on the test node ND_T in response to the charging control signal CTR_C and the discharging control signal CTR_D.

The test core 100 may output the interval signal CTR_P corresponding to the first measurement interval MT1.

The operation circuit 200 may generate the first counting value CNT1 by counting the clock signal CLK_CN based on the interval signal CTR_P, and may store the first counting value CNT1.

The test core 100 may adjust the charging current quantity I1 to a second value higher than the first value prior to the second measurement interval MT2, and may adjust the charging current quantity I1 to the initial value again after the second measurement interval MT2 is terminated.

During the second measurement interval MT2, the test core 100 may repeatedly perform charging and discharging on the test node ND_T in response to the charging control signal CTR_C and the discharging control signal CTR_D.

The test core 100 may output the interval signal CTR_P corresponding to the second measurement interval MT2.

The operation circuit 200 may generate the second counting value CNT2 by counting the clock signal CLK_CN based on the interval signal CTR_P, may store the second counting value CNT2, may perform subtraction on the first counting value CNT1 and the second counting value CNT2, may store a difference value between the first counting value CNT1 and the second counting value CNT2 as the operation results CNT_SUB, and may output, as the test result information INF_TST, at least one of the first counting value CNT1, the second counting value CNT2, and the operation results CNT_SUB that have been stored.

Figure 6:
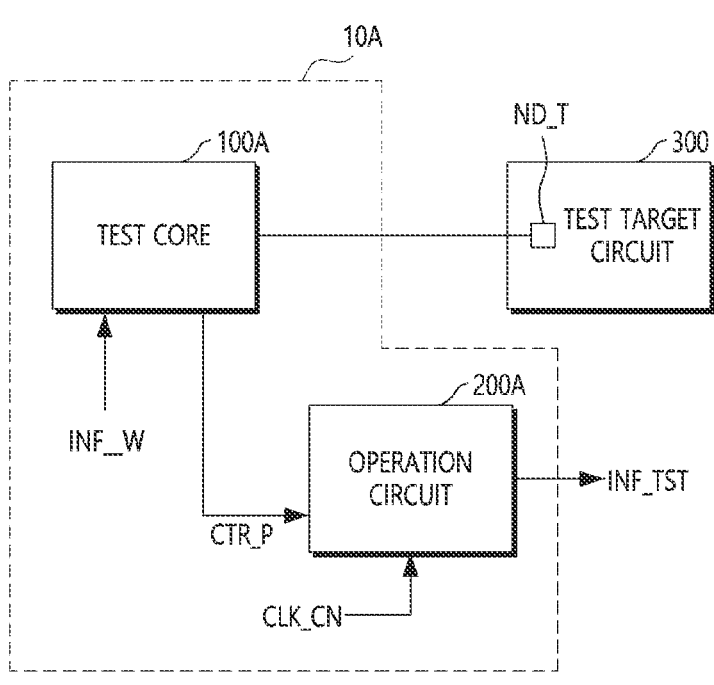
FIG. 6 is a diagram illustrating a construction of a test circuit according to an embodiment.

FIG. 6 is a diagram illustrating a construction of a test circuit 10A according to an embodiment.

Referring to FIG. 6, the test circuit 10A may include a test core 100A and an operation circuit 200A. The test circuit 10A may be coupled to a test node ND_T of a test target circuit 300.

The test target circuit 300 may be the same as the test target circuit 300 that has been described with reference to FIG. 1. Accordingly, the test target circuit 300 may be assigned the same reference numeral as the test target circuit 300 that has been described with reference to FIG. 1, and a description thereof is omitted.

The test core 100A may set one of a charging reference voltage and a discharging reference voltage as a first value and repeatedly perform charging and discharging on the test node ND_T at least once during a first measurement interval, and may change one of the charging reference voltage and the discharging reference voltage from the first value to a second value and repeatedly perform charging and discharging on the test node ND_T at least once during a second measurement interval.

The test core 100A may be coupled to the test node ND_T, may receive interval setting information INF_W, and may output an interval signal CTR_P. The test core 100A may vary at least one of the first measurement interval and the second measurement interval in response to the interval setting information INF_W, and may generate the interval signal CTR_P corresponding to the first measurement interval and the second measurement interval.

The operation circuit 200A may receive the interval signal CTR_P and a clock signal CLK_CN, and may output test result information INF_TST. The operation circuit 200A may generate a first counting value by counting the clock signal CLK_CN during the first measurement interval, may generate a second counting value by counting the clock signal CLK_CN during the second measurement interval, may generate the results of an operation of the first counting value and the second counting value as operation results, and may output at least one of the first counting value, the second counting value, and the operation results as the test result information INF_TST. The clock signal CLK_CN may be a clock signal for a counting operation. The clock signal CLK_CN may be a signal that is provided within the test circuit 10 or from the outside of the test circuit 10.

The operation circuit 200A may include at least one of the first counting value and the second counting value in the test result information INF_TST as reference information for determining a high resistive defect in the test target circuit 300. The operation circuit 200A may include the operation results in the test result information INF_TST as reference information for determining a leakage current defect in the test target circuit 300.

A test result determination system outside the test circuit 10A may determine the high resistive defect in the test target circuit 300 based on the first counting value or the second counting value that is provided by the test circuit 10A, and may determine the leakage current defect in the test target circuit 300 based on the operation results that are provided by the test circuit 10A.

Figure 7:
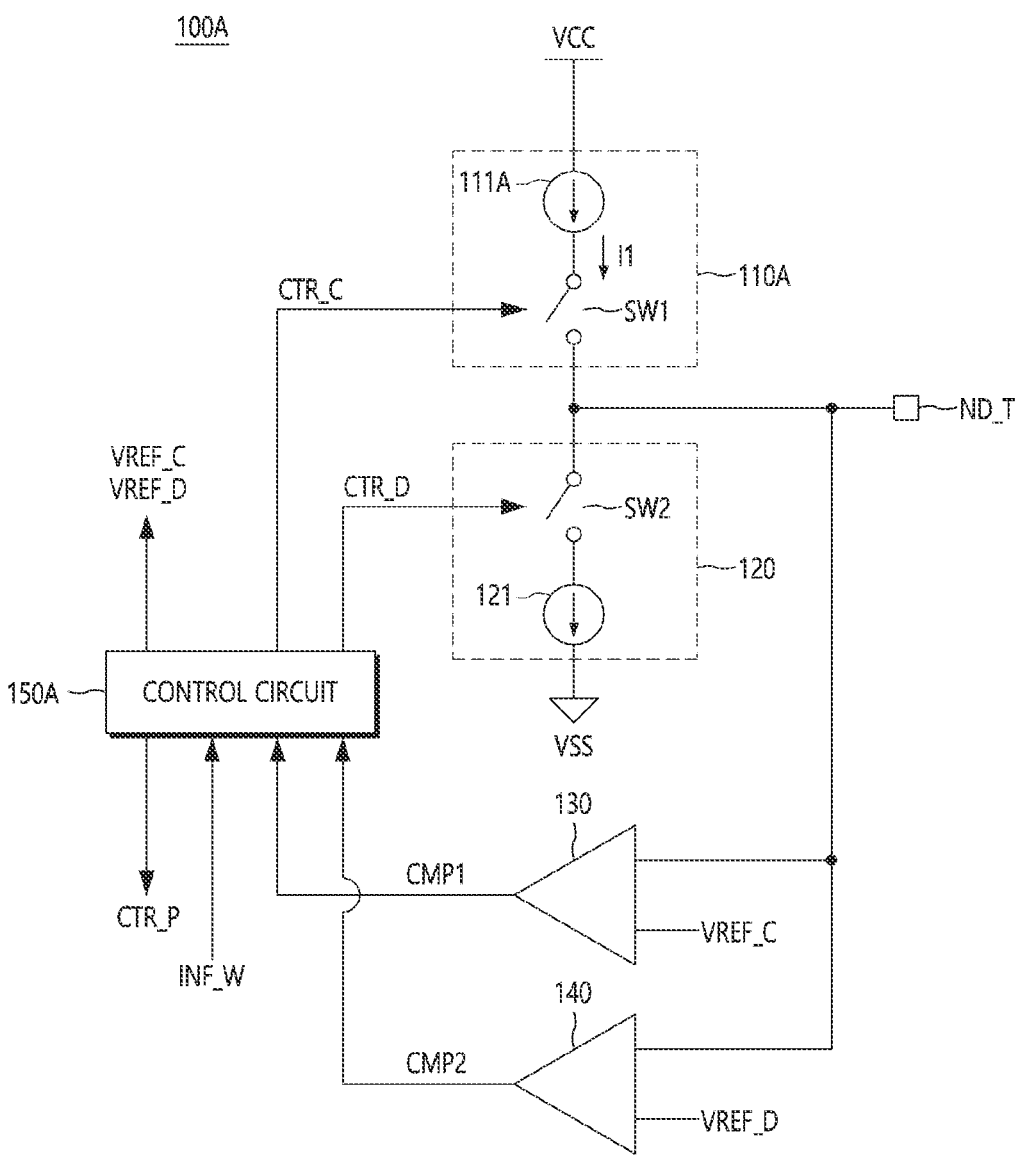
FIG. 7 is a diagram illustrating a construction of a test core illustrated in FIG. 6.

FIG. 7 is a diagram illustrating a construction of the test core 100A illustrated in FIG. 6.

Referring to FIG. 7, the test core 100A may include a charging circuit 110A, a discharging circuit 120, a first comparison circuit 130, a second comparison circuit 140, and a control circuit 150A.

The charging circuit 110A may charge the test node ND_T in response to a charging control signal CTR_C. The charging circuit 110A may include a first current source circuit 111A and a first switching circuit SW1 that are coupled in series between a power supply stage VCC and the test node ND_T. The first switching circuit SW1 may control an operation of coupling the first current source circuit 111A and the test node ND_T in response to the charging control signal CTR_C. The first switching circuit SW1 may be turned on when the charging control signal CTR_C has a high level, and may be turned off when the charging control signal CTR_C has a low level.

The discharging circuit 120 may discharge the test node ND_T in response to a discharging control signal CTR_D. The discharging circuit 120 may include a second switching circuit SW2 and a second current source circuit 121 that are coupled in series between the test node ND_T and a ground power stage VSS. The second switching circuit SW2 may control an operation of coupling the test node ND_T and the second current source circuit 121 in response to the discharging control signal CTR_D. The second switching circuit SW2 may be turned on when the discharging control signal CTR_D has a high level, and may be turned off when the discharging control signal CTR_D has a low level.

The first comparison circuit 130 may generate a first comparison signal CMP1 by comparing the voltage level of the test node ND_T and the voltage level of a charging reference voltage VREF_C. The charging reference voltage VREF_C may correspond to a charging voltage level, that is, a target, after the start of a charging operation for the test node ND_T. The first comparison circuit 130 may generate the first comparison signal CMP1 capable of turning on the first switching circuit SW1 of the charging circuit 110 when the voltage level of the test node ND_T is lower than the voltage level of the charging reference voltage VREF_C.

The second comparison circuit 140 may generate a second comparison signal CMP2 by comparing the voltage level of the test node ND_T and the voltage level of a discharging reference voltage VREF_D. The discharging reference voltage VREF_D may correspond to a discharging voltage level, that is, a target, after the start of a discharging operation for the test node ND_T. The second comparison circuit 140 may generate the second comparison signal CMP2 capable of turning on the second switching circuit SW2 of the discharging circuit 120 when the voltage level of the test node ND_T is higher than the voltage level of the discharging reference voltage VREF_D.

The control circuit 150A may receive an interval setting information INF_W, the first comparison signal CMP1, and the second comparison signal CMP2, and may output the charging control signal CTR_C, the discharging control signal CTR_D, an interval signal CTR_P, the charging reference voltage VREF_C, and the discharging reference voltage VREF_D. The control circuit 150 may vary at least one of a first measurement interval and a second measurement interval in response to the interval setting information INF_W.

The control circuit 150A may generate the interval signal CTR_P corresponding to the first measurement interval and the second measurement interval that have been adjusted in response to the interval setting information INF_W. The control circuit 150 may generate the charging control signal CTR_C and the discharging control signal CTR_D by using the first comparison signal CMP1 and the second comparison signal CMP2 based on the interval signal CTR_P. The control circuit 150 may maintain the charging control signal CTR_C to a deactivation level, for example, a low level, during a deactivation interval that belongs to a deactivation interval of the interval signal CTR_P and that corresponds to a standby interval between the first measurement interval and the second measurement interval, and may output the first comparison signal CMP1 as the charging control signal CTR_C and the second comparison signal CMP2 as the discharging control signal CTR_D during the remaining intervals of the deactivation interval of the interval signal CTR_P.

The control circuit 150A may adjust the voltage level of at least one of the charging reference voltage VREF_C and the discharging reference voltage VREF_D according to the first comparison signal CMP1 and the second comparison signal CMP2 to match preset test timing. For example, the control circuit 150 may maintain the voltage level of the charging reference voltage VREF_C to a first value, and may adjust the voltage level of the charging reference voltage VREF_C to a second value lower than the first value prior to the second measurement interval.

Figure 8:
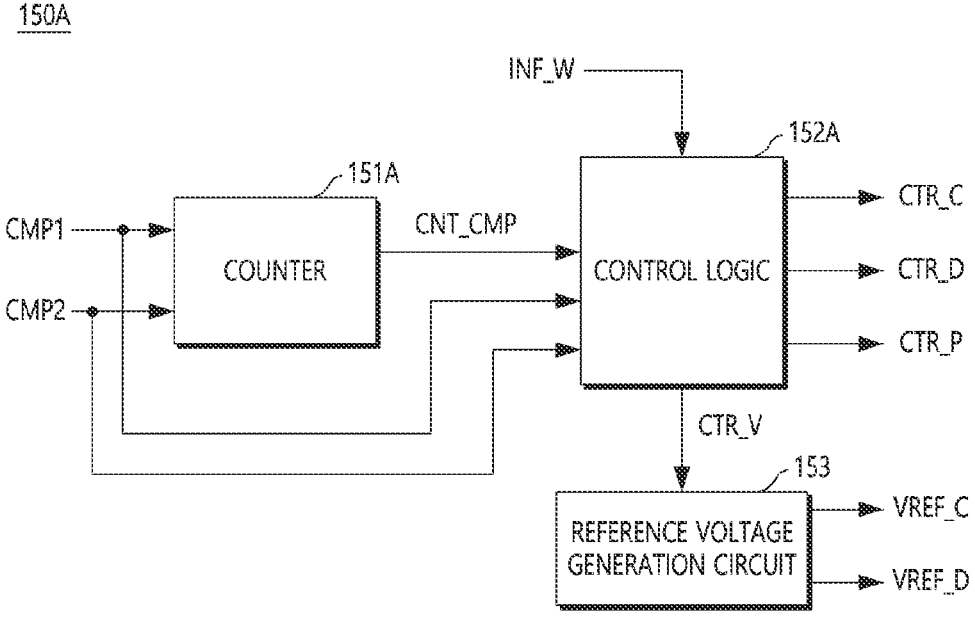
FIG. 8 is a diagram illustrating a construction of a control circuit illustrated in FIG. 7.

FIG. 8 is a diagram illustrating a construction of the control circuit 150A illustrated in FIG. 7.

Referring to FIG. 8, the control circuit 150A may include a counter 151A, control logic 152A, and a reference voltage generation circuit 153.

The counter 151A may generate a counting signal CNT_CMP by counting at least one of the first comparison signal CMP1 and the second comparison signal CMP2.

The reference voltage generation circuit 153 may adjust the voltage level of at least one of the charging reference voltage VREF_C and the discharging reference voltage VREF_D in response to a voltage control signal CTR_V.

The control logic 152A may generate the charging control signal CTR_C, the discharging control signal CTR_D, the interval signal CTR_P, and the voltage control signal CTR_V, in response to the interval setting information INF_W, the counting signal CNT_CMP, the first comparison signal CMP1, and the second comparison signal CMP2.

The control logic 152A may generate the interval signal CTR_P corresponding to the first measurement interval and the second measurement interval that have been adjusted in response to the interval setting information INF_W. The control logic 152A may maintain the charging control signal CTR_C to a deactivation level, for example, a low level, during a deactivation interval that belongs to a deactivation interval of the interval signal CTR_P and that corresponds to a standby interval between the first measurement interval and the second measurement interval, and may output the first comparison signal CMP1 as the charging control signal CTR_C and the second comparison signal CMP2 as the discharging control signal CTR_D during the remaining intervals of the deactivation interval of the interval signal CTR_P.

The control logic 152A may maintain the voltage level of the charging reference voltage VREF_C to a first value by using the voltage control signal CTR_V, and may adjust the voltage level of the charging reference voltage VREF_C to a second value lower than the first value prior to the second measurement interval.

Figure 9:
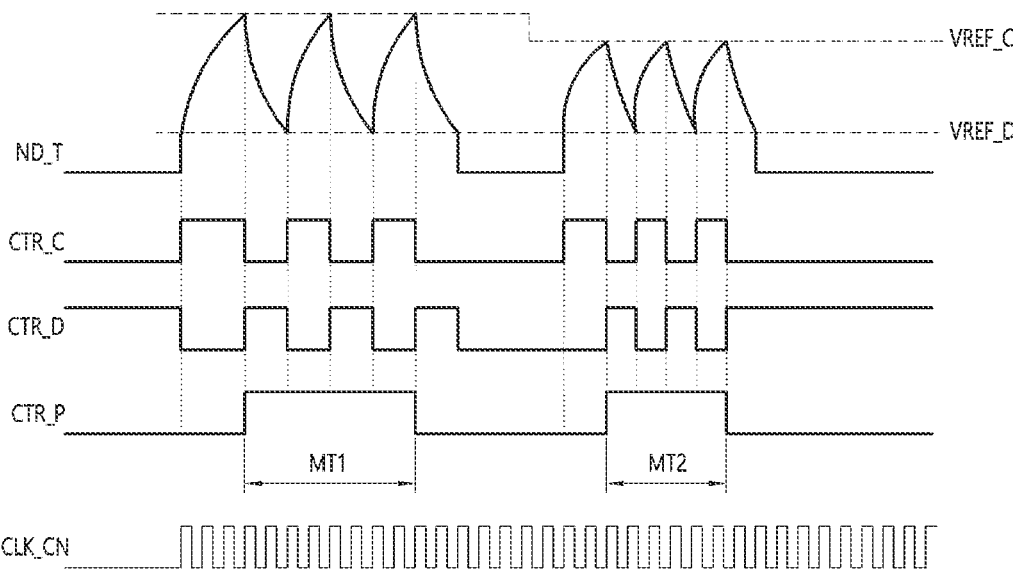
FIG. 9 is an operation timing diagram of the test circuit illustrated in FIG. 6.

FIG. 9 is an operation timing diagram of the test circuit 100A illustrated in FIG. 6.

Hereinafter, an operation of the test circuit 10A is described with reference to FIGS. 6 to 9.

When the charging control signal CTR_C is activated to a high level, the voltage level of the test node ND_T may gradually increase and rise up to the charging reference voltage VREF_C. When the discharging control signal CTR_D is activated to a high level, the voltage level of the test node ND_T may gradually decrease and drop up to the discharging reference voltage VREF_D. The charging control signal CTR_C and the discharging control signal CTR_D may transition based on the voltage level of the test node ND_T.

The test core 100A may initially maintain the voltage level of the charging reference voltage VREF_C to a first value.

During the first measurement interval MT1, the test core 100A may repeatedly perform charging and discharging on the test node ND_T in response to the charging control signal CTR_C and the discharging control signal CTR_D.

The test core 100A may output the interval signal CTR_P corresponding to the first measurement interval MT1.

The operation circuit 200A may generate the first counting value CNT1 by counting the clock signal CLK_CN based on the interval signal CTR_P, and may store the first counting value CNT1.

The test core 100A may maintain the voltage level of the charging reference voltage VREF_C to the first value, and may adjust the voltage level of the charging reference voltage VREF_C to a second value lower than the first value prior to the second measurement interval.

During the second measurement interval MT2, the test core 100A may repeatedly perform charging and discharging on the test node ND_T in response to the charging control signal CTR_C and the discharging control signal CTR_D.

The test core 100A may output the interval signal CTR_P corresponding to the second measurement interval MT2.

The operation circuit 200A may generate the second counting value CNT2 by counting the clock signal CLK_CN based on the interval signal CTR_P, may store the second counting value CNT2, may perform subtraction on the first counting value CNT1 and the second counting value CNT2, may store a difference value between the first counting value CNT1 and the second counting value CNT2 as the operation results CNT_SUB, and may output, as the test result information INF_TST, at least one of the first counting value CNT1, the second counting value CNT2, and the operation results CNT_SUB that have been stored.

Figure 10:
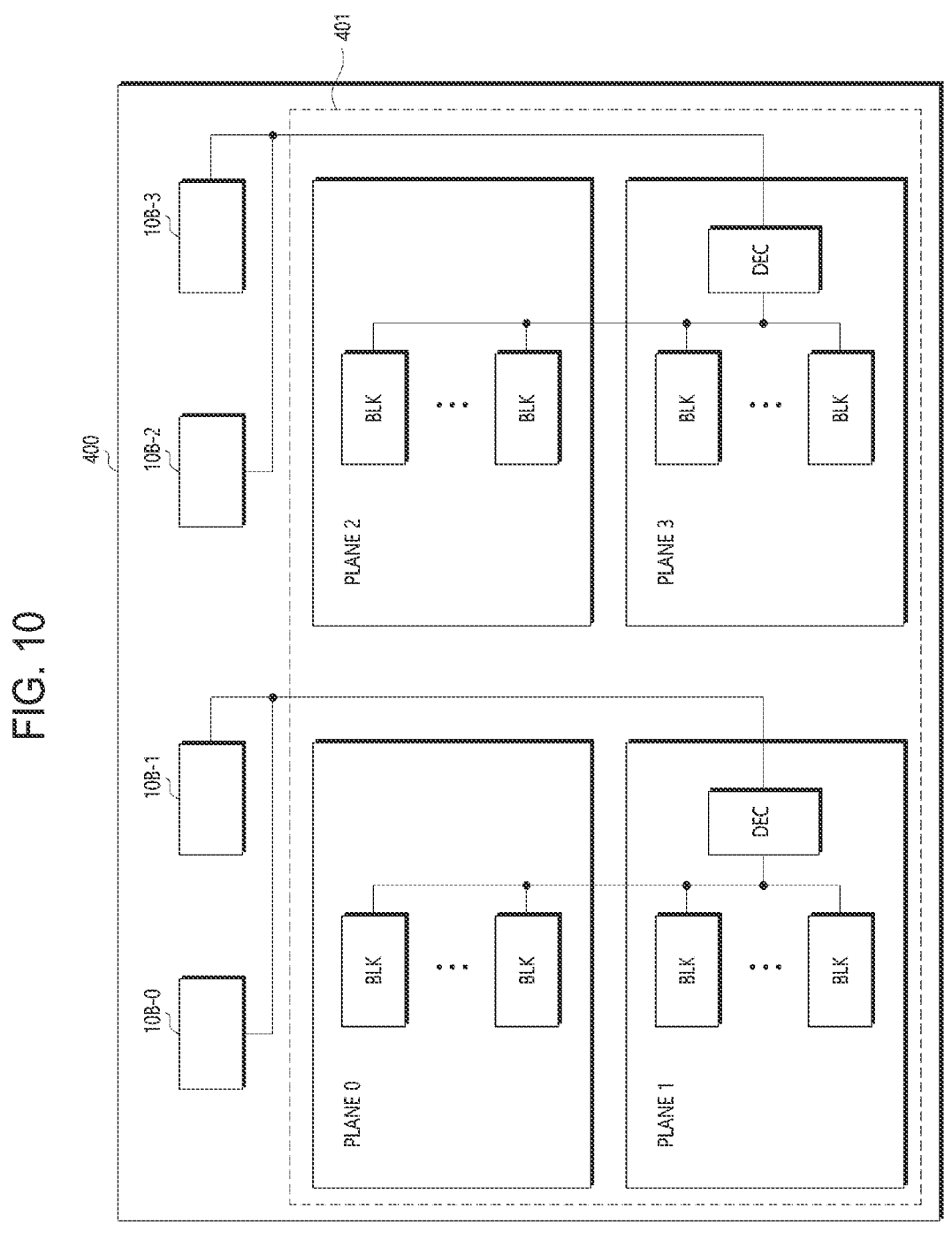
FIG. 10 is a diagram illustrating a construction of a semiconductor memory system according to an embodiment.

FIG. 10 is a diagram illustrating a construction of a semiconductor memory system 400 according to an embodiment.

Referring to FIG. 10, the semiconductor memory system 400 may include a memory device 401 and a plurality of test circuits 10B-0 to 10B-3.

The memory device 401 may include a plurality of memory cells that are coupled to a plurality of word lines. The plurality of memory cells may be divided into a plurality of first unit areas, for example, a plurality of planes PLANE0 to PLANE3. The plurality of planes PLANE0 to PLANE3 may each be divided into a plurality of second unit areas, for example, a plurality of blocks BLK.

The memory device 401 may include at least one decoder DEC for selectively coupling at least one of the word lines of the plurality of blocks BLK to the plurality of test circuits 10B-0 to 10B-3.

For example, the plurality of test circuits 10B-0 to 10B-3 may be allocated to the plurality of planes PLANE0 to PLANE3 one by one.

The plurality of test circuits 10B-0 to 10B-3 may perform tests on by block BLK, and may perform tests by word line.

Each of the plurality of test circuits 10B-0 to 10B-3 may be constructed identically with the test circuit 10 that has been described with reference to FIG. 1 or the test circuit 10A that has been described with reference to FIG. 6.

In an embodiment, the first counting value CNT1 or the second counting value CNT2 may be reduced depending on differences between the locations of the plurality of test circuits 10B-0 to 10B-3 and the plurality of blocks BLK, and may be proportional to the distance. Accordingly, in an embodiment, a high resistive defect in the word line can be detected based on the first counting value CNT1 or the second counting value CNT2.

In an embodiment, the operation results CNT_SUB for blocks within the same plane, that is, a difference between the first counting value CNT1 and the second counting value CNT2, are constant when a leakage current defect is not present, but are different when a leakage current defect is present. Accordingly, in an embodiment, the leakage current defect can be detected based on the operation results CNT_SUB.

As described above, those skilled in the art to which the present technology pertains may understand that the present technology may be implemented in various other forms without departing from the technical spirit or essential characteristics of the present technology. Accordingly, it is to be understood that the aforementioned embodiments are illustrative from all aspects not being limitative. The scope of the present technology is defined by the appended claims rather than by the detailed description, and all modifications or variations derived from the meanings and scope of the claims and equivalents thereof should be understood as being included in the scope of the present technology.

12

What is claimed is:

1. A test circuit comprising:
a test core configured to set a charging current quantity as a first value and perform charging and discharging on a test node of a test target circuit during a first measurement interval and configured to change the charging current quantity from the first value to a second value and perform charging and discharging on the test node during a second measurement interval; and
an operation circuit configured to generate a first counting value by counting a clock signal during the first measurement interval, generate a second counting value by counting the clock signal during the second measurement interval, generate results of an operation of the first counting value and the second counting value as operation results, and output at least one of the first counting value, the second counting value, and the operation results as test result information.

2. The test circuit according to claim 1, wherein the test core is configured to perform the charging and discharging at least once during the first measurement interval and to perform the charging and discharging at least once during the second measurement interval.

3. The test circuit according to claim 1, wherein the test core comprises:
a charging circuit configured to charge the test node in response to a charging control signal and to vary the charging current quantity in response to a current control signal;
a discharging circuit configured to discharge the test node in response to a discharging control signal;
a first comparison circuit configured to generate a first comparison signal by comparing voltage levels of the test node and a charging reference voltage;
a second comparison circuit configured to generate a second comparison signal by comparing voltage levels of the test node and a discharging reference voltage; and
a control circuit configured to generate the charging control signal, the discharging control signal, and the current control signal in response to at least one of the first comparison signal and the second comparison signal.

4. The test circuit according to claim 1, wherein the test core is configured to vary at least one of the first measurement interval and the second measurement interval in response to the interval setting information and to generate an interval signal corresponding to the first measurement interval and the second measurement interval.

5. The test circuit according to claim 4, wherein the operation circuit is configured to generate the first counting value and the second counting value by counting the clock signal during an activation interval of the interval signal.

6. The test circuit according to claim 1, wherein the operation circuit is configured to:
generate a difference value between the first counting value and the second counting value as the operation results;
output at least one of the first counting value and the second counting value as test result information for determining a high resistive defect in the test target circuit; and
output the operation results as the test result information for determining a leakage current defect in the test target circuit.

7. A test circuit comprising:
a test core configured to set one of a charging reference voltage and a discharging reference voltage as a first value and perform charging and discharging on a test node of a test target circuit during a first measurement interval and configured to change one of the charging reference voltage and the discharging reference voltage from the first value to a second value and to perform charging and discharging on the test node during a second measurement interval; and an operation circuit configured to generate a first counting value by counting a clock signal during the first measurement interval, generate a second counting value by counting the clock signal during the second measurement interval, generate results of an operation of the first counting value and the second counting value as operation results, and output at least one of the first counting value, the second counting value, and the operation results as test result information.

8. The test circuit according to claim 7, wherein the test core is configured to perform the charging and discharging at least once during the first measurement interval and to perform the charging and discharging at least once during the second measurement interval.

9. The test circuit according to claim 7, wherein the test core comprises:

a charging circuit configured to charge the test node in response to a charging control signal;

a discharging circuit configured to discharge the test node in response to a discharging control signal;

a first comparison circuit configured to generate a first comparison signal by comparing voltage levels of the test node and a charging reference voltage;

a second comparison circuit configured to generate a second comparison signal by comparing voltage levels of the test node and a discharging reference voltage; and a control circuit configured to generate the charging control signal and the discharging control signal in response to at least one of the first comparison signal and the second comparison signal and control a voltage level of at least one of the charging reference voltage and the discharging reference voltage.

10. The test circuit according to claim 7, wherein the test core is configured to vary at least one of the first measurement interval and the second measurement interval in response to the interval setting information and to generate an interval signal corresponding to the first measurement interval and the second measurement interval.

11. The test circuit according to claim 10, wherein the operation circuit is configured to generate the first counting value and the second counting value by counting the clock signal during an activation interval of the interval signal.

12. The test circuit according to claim 7, wherein the operation circuit is configured to:

generate a difference value between the first counting value and the second counting value as the operation results;

output at least one of the first counting value and the second counting value as test result information for determining a high resistive defect in the test target circuit; and output the operation results as the test result information for determining a leakage current defect in the test target circuit.

13. A semiconductor memory system comprising:

a memory device comprising a plurality of memory cells that are coupled to a plurality of word lines, wherein the plurality of memory cells are divided into a plurality of first unit areas and each of the plurality of first unit areas is divided into a plurality of second unit areas; and a test circuit that is coupled to at least one of the plurality of first unit areas, wherein the test circuit is configured to:

set a charging current quantity as a first value and perform charging and discharging on a test node during a first measurement interval;

change the charging current quantity from the first value to a second value and perform the charging and discharging on the test node during a second measurement interval;

generate a first counting value and a second counting value by counting the first measurement interval and the second measurement interval;

generate results of an operation of the first counting value and the second counting value as operation results; and output at least one of the first counting value, the second counting value, and the operation results as test result information.

14. The semiconductor memory system according to claim 13, wherein the test circuit is configured to:

perform the charging and discharging at least once during the first measurement interval; and perform the charging and discharging at least once during the second measurement interval.

15. The semiconductor memory system according to claim 13, wherein the test circuit comprises:

a charging circuit configured to charge the test node in response to a charging control signal and to vary the charging current quantity in response to a current control signal;

a discharging circuit configured to discharge the test node in response to a discharging control signal;

a first comparison circuit configured to generate a first comparison signal by comparing voltage levels of the test node and a charging reference voltage;

a second comparison circuit configured to generate a second comparison signal by comparing voltage levels of the test node and a discharging reference voltage;

a control circuit configured to generate the charging control signal, the discharging control signal, and the current control signal in response to at least one of the first comparison signal and the second comparison signal; and an operation circuit configured to generate the first counting value by counting a clock signal during the first measurement interval, generate the second counting value by counting the clock signal during the second measurement interval, generate the results of the operation of the first counting value and the second counting value as the operation results, and output at least one of the first counting value, the second counting value, and the operation results as the test result information.

16. The semiconductor memory system according to claim 13, wherein the test circuit is configured to:

set one of a charging reference voltage and a discharging reference voltage as a first value and perform the charging and discharging on the test node of a test target circuit during the first measurement interval; and change one of the charging reference voltage and the discharging reference voltage from the first value to a second value during the second measurement interval and perform the charging and discharging on the test node.

17. The semiconductor memory system according to claim 13, wherein the test circuit comprises:

a charging circuit configured to charge the test node in response to a charging control signal and to vary the charging current quantity in response to a current control signal;

a discharging circuit configured to discharge the test node in response to a discharging control signal;

a first comparison circuit configured to generate a first comparison signal by comparing voltage levels of the test node and a charging reference voltage;

a second comparison circuit configured to generate a second comparison signal by comparing voltage levels of the test node and a discharging reference voltage;

a control circuit configured to generate the charging control signal and the discharging control signal in response to at least one of the first comparison signal and the second comparison signal and to control a voltage level of at least one of the charging reference voltage and the discharging reference voltage, and an operation circuit configured to generate the first counting value by counting a clock signal during the first measurement interval, generate the second counting value by counting the clock signal during the second measurement interval, generate the results of the operation of the first counting value and the second counting value as the operation results, and output at least one of the first counting value, the second counting value, and the operation results as the test result information.

18. The semiconductor memory system according to claim 13, wherein the test circuit is configured to:

generate a difference value between the first counting value and the second counting value as the operation results;

output at least one of the first counting value and the second counting value as the test result information for determining a high resistive defect in a test target circuit; and output the operation results as the test result information for determining a leakage current defect in the test target circuit.

\* \* \* \* \*